(12) United States Patent (10) Patent No.: US 11,657,121 B2
Takeuchi (45) Date of Patent: May 23, 2023

(54) ABNORMALITY DETECTION DEVICE, ABNORMALITY DETECTION METHOD AND COMPUTER READABLE MEDIUM

(71) Applicant: Mitsubishi Electric Corporation, Tokyo (JP)

(72) Inventor: Tomoharu Takeuchi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 344 days.

(21) Appl. No.: 17/078,371

(22) Filed: Oct. 23, 2020

(65) Prior Publication Data

US 2021/0042585 A1 Feb. 11, 2021

Related U.S. Application Data

(63) Continuation of application No. PCT/JP2018/022709, filed on Jun. 14, 2018.

(51) Int. Cl.
*G06F 17/18* (2006.01)
*G06F 18/21* (2023.01)
(Continued)

(52) U.S. Cl.
CPC .............. *G06F 17/18* (2013.01); *G06F 18/10* (2023.01); *G06F 18/2193* (2023.01); *G06F 18/22* (2023.01)

(58) Field of Classification Search
CPC .......... G06F 17/18; G06F 18/10; G06F 18/22; G06F 18/2193
See application file for complete search history.

(56) References Cited

U.S. PATENT DOCUMENTS 9,483,049 B2 * 11/2016 Maeda ............... G06K 9/00536
10,794,941 B2 * 10/2020 Ojima ..................... G06N 20/00
(Continued)

FOREIGN PATENT DOCUMENTS

CN 102844721 A 12/2012
EP 3 299 918 A1 3/2018
(Continued)

OTHER PUBLICATIONS

Chinese Office Action and Search Report for Chinese Application No. 201880094472.4, dated May 6, 2022, with English translation.
(Continued)

*Primary Examiner* — Bryan Bui
(74) *Attorney, Agent, or Firm* — Birch, Stewart, Kolasch & Birch, LLP

(57) ABSTRACT

A deviation inclination calculation unit (22) calculates a deviation score by using evaluation data obtained from a subject apparatus as an input, in each of a plurality of outlier detection methods specifying data deviated from other data from among subject data, and calculating deviation scores indicating deviation degrees of the data specified, and calculates deviation inclination information from the deviation scores calculated. An abnormality detection unit (23) calculates, for each abnormality pattern, a similarity degree between deviation sensitivity information indicating sensitivity for each of a plurality of abnormality patterns with respect to each of the plurality of outlier detection methods, and the deviation inclination information calculated, and detects an abnormality of the subject apparatus.

11 Claims, 19 Drawing Sheets

(51) Int. Cl.
*G06F 18/10* (2023.01)
*G06F 18/22* (2023.01)

(56) References Cited

U.S. PATENT DOCUMENTS

| | | |
|---|---|---|
| 2005/0194590 A1 | 9/2005 | Matsushita et al. |
| 2009/0030753 A1 | 1/2009 | Senturk-Doganaksoy et al. |
| 2011/0191076 A1 | 8/2011 | Maeda et al. |
| 2012/0041575 A1 | 2/2012 | Maeda et al. |
| 2012/0166142 A1 | 6/2012 | Maeda et al. |
| 2012/0310597 A1 | 12/2012 | Uchiyama et al. |
| 2012/0316835 A1 | 12/2012 | Maeda et al. |
| 2013/0073260 A1 | 3/2013 | Maeda et al. |
| 2013/0173218 A1 | 7/2013 | Maeda et al. |
| 2015/0169393 A1 | 6/2015 | Shibuya |
| 2016/0026915 A1 | 1/2016 | Delp |
| 2016/0045174 A1 | 2/2016 | Wendlandt et al. |
| 2016/0312108 A1 | 10/2016 | Lestz et al. |
| 2016/0381077 A1 | 12/2016 | Bassias et al. |
| 2017/0169360 A1 | 6/2017 | Veeramachaneni et al. |
| 2017/0272471 A1 | 9/2017 | Veeramachaneni et al. |
| 2017/0336775 A1 | 11/2017 | Tokorozuki et al. |
| 2017/0339192 A1 | 11/2017 | Veeramachaneni et al. |
| 2019/0196443 A1 | 6/2019 | Tokorozuki et al. |

FOREIGN PATENT DOCUMENTS

| | | |
|---|---|---|
| JP | 4-121622 A | 4/1992 |
| JP | 2000-346681 A | 12/2000 |
| JP | 2005-251925 A | 9/2005 |
| JP | 2005-345154 A | 12/2005 |
| JP | 2009-76056 A | 4/2009 |
| JP | 2010-92355 A | 4/2010 |
| JP | 2010-191556 A | 9/2010 |
| JP | 2011-59790 A | 3/2011 |
| JP | 2011-76334 A | 4/2011 |
| JP | 2011-145846 A | 7/2011 |
| JP | 2011-227706 A | 11/2011 |
| JP | 2012-58890 A | 3/2012 |
| JP | 2012-78142 A | 4/2012 |
| JP | 2012-155361 A | 8/2012 |
| JP | 2013-175108 A | 9/2013 |
| JP | 2015-88078 A | 5/2015 |
| JP | 2015-114967 A | 6/2015 |
| JP | 2015-127914 A | 7/2015 |
| JP | 2016-218961 A | 12/2016 |
| JP | 2017-10232 A | 1/2017 |
| JP | 2017-156818 A | 9/2017 |
| JP | 2017-211713 A | 11/2017 |
| WO | WO 2011/104760 A1 | 9/2011 |
| WO | WO 2016/208315 A1 | 12/2016 |
| WO | WO 2017/150263 A1 | 9/2017 |

OTHER PUBLICATIONS

International Search Report for PCT/JP2018/022709, dated Aug. 28, 2018.
Indian Office Action for Indian Application No. 202047053439, dated Dec. 16, 2021, with English translation.
European Communication pursuant to Article 94(3) EPC for corresponding European Application No. 18922746.5, dated Oct. 5, 2022.

* cited by examiner

Fig. 6

|  | VARIABLE 1 | ... | VARIABLE k |
|---|---|---|---|
| TIME t-m |  |  |  |
| ... |  |  |  |
| TIME t |  |  |  |

Rows: L PIECES
Columns (variables): k PIECES
Operation data at time t

Fig. 9

FORM 1

| OUTLIER DETECTION METHOD | ABNORMALITY PATTERN | | | | | | |
|---|---|---|---|---|---|---|---|
| | (1) | (2) | ... | (X) | (1)+(2) | ... | (1)+(2)+(3) | ... | (1)+...+(X) |
| (1) | 1 | 1 | ... | 0 | 1 | ... | 1 | ... | 1 |
| (2) | 0 | 1 | ... | 0 | 1 | ... | 1 | ... | 1 |
| (3) | 1 | 1 | ... | 0 | 1 | ... | 0 | ... | 1 |
| (4) | 0 | 1 | ... | 0 | 1 | ... | 1 | ... | 1 |
| (5) | 0 | 0 | ... | 0 | 0 | ... | 1 | ... | 1 |
| ... | ... | ... | ... | ... | ... | ... | ... | ... | ... |
| (N) | 0 | 0 | ... | 1 | 0 | ... | 0 | ... | 1 |

FORM 2

| | | ABNORMALITY PATTERN | | | | | | |
|---|---|---|---|---|---|---|---|---|
| | | (1) | (2) | ... | (X) | (1)+(2) | (1)+(2)+(3) | ... | (1)+...+(X) |
| OUTLIER DETECTION METHOD | (1) | 0.8 | 0.9 | ... | 0 | 0.9 | 0.9 | ... | 0.9 |
| | (2) | 0 | 0.7 | ... | 0 | 0.7 | 0.7 | ... | 0.9 |
| | (3) | 0.7 | 0.6 | ... | 0 | 0.9 | 0.6 | ... | 0.9 |
| | (4) | 0 | 0.8 | ... | 0 | 0.8 | 0.8 | ... | 0.9 |
| | (5) | 0 | 0 | ... | 0 | 0 | 0.5 | ... | 0.7 |
| | ... | ... | ... | ... | ... | ... | ... | ... | ... |
| | (N) | 0 | 0 | ... | 0.9 | 0 | 0 | ... | 0.9 |

FORM 3

| OUTLIER DETECTION METHOD | ABNORMALITY PATTERN | | | | | | | |
|---|---|---|---|---|---|---|---|---|
| | (1) | (2) | ... | (X) | (1)+(2) | ... | (1)+(2)+(3) | ... | (1)+...+(X) |
| (1) | 0.2 | 0.2 | ... | 0 | 0.2 | ... | 0.3 | ... | 0.3 |
| (2) | 0 | 0.1 | ... | 0 | 0.1 | ... | 0.1 | ... | 0.1 |
| (3) | 0.2 | 0.1 | ... | 0 | 0.1 | ... | 0 | ... | 0.2 |
| (4) | 0 | 0.2 | ... | 0 | 0.2 | ... | 0.1 | ... | 0.1 |
| (5) | 0 | 0 | ... | 0 | 0 | ... | 0.3 | ... | 0.3 |
| ... | ... | ... | ... | ... | ... | ... | ... | ... | ... |
| (N) | 0 | 0 | ... | 0.4 | 0 | ... | 0 | ... | 0.3 |

FORM 4

| OUTLIER DETECTION METHOD | ABNORMALITY PATTERN | | | | | | | |
|---|---|---|---|---|---|---|---|---|
| | (1) | (2) | ... | (X) | (1)+(2) | (1)+(2)+(3) | ... | (1)+...+(X) |
| (1) | 0.15 | 0.2 | ... | 0 | 0.2 | 0.2 | ... | 0.2 |
| (2) | 0 | 0.1 | ... | 0 | 0.1 | 0.1 | ... | 0.2 |
| (3) | 0.05 | 0.1 | ... | 0 | 0.2 | 0.1 | ... | 0.2 |
| (4) | 0 | 0.2 | ... | 0 | 0.2 | 0.2 | ... | 0.3 |
| (5) | 0 | 0 | ... | 0 | 0 | 0.4 | ... | 0.6 |
| ... | ... | ... | ... | ... | ... | ... | ... | ... |
| (N) | 0 | 0 | ... | 0.3 | 0 | 0 | ... | 0.3 |

M

ABNORMALITY DETECTION DEVICE, ABNORMALITY DETECTION METHOD AND COMPUTER READABLE MEDIUM

CROSS REFERENCE TO RELATED APPLICATION

This application is a Continuation of PCT International Application No. PCT/JP2018/022709, filed on Jun. 14, 2018, which is hereby expressly incorporated by reference into the present application.

TECHNICAL FIELD

The present invention relates to a technique to detect abnormality of a target apparatus based on data obtained from a target apparatus.

BACKGROUND ART

In a field of preventive maintenance and apparatus maintenance, in order to reasonably perform execution of maintenance and inventory management to the minimum necessary, technological development to detect or predict signs of deterioration or failure of apparatuses has been performed. While sensor networks and big data analysis are attracting attention, techniques to sense operating conditions of apparatuses, and to detect abnormality or predict failure based on physical analysis or statistical prediction, have been developed.

With respect to abnormality detection of apparatuses, it is often adopted an approach to construct an abnormality detection model after collecting operation data of apparatuses, and comprehending features of data at a normal time and an abnormal time.

In a method disclosed in Patent Literature 1, abnormality is detected and factors are presented by using a plurality of abnormality diagnosis models in process monitoring in a plant. In Patent Literature 1, an abnormality diagnosis model using principal component analysis or discrete wavelet transform is constructed beforehand, and the abnormality diagnosis model is applied to online abnormality detection in process monitoring.

In order to construct an abnormality diagnosis model, it is necessary to analyze data features at a normal time and an abnormal time, and to comprehend statistical feature quantity which makes estimation of an apparatus condition possible. However, since many of long-life apparatuses, such as an electric generator and an elevator, for example, are maintained before failure, it is often the case that none of a manufacturer, a maintenance operator and an apparatus introducer (user) owns failure data. Therefore, it is difficult to adopt a method to perform abnormality detection by preliminarily studying apparatus conditions and variation in measurement data at failure.

An outlier detection technique is a technique to extract data that is deviated from among overall data, based on binary judgment of normal or abnormality. As outlier detection techniques, there are various methods such as a statistical method, a machine learning system method and a deep machine learning system method. When an outlier detection method is applied to abnormality detection of an apparatus, a most suitable method is selected from various outlier detection methods based on features of apparatus sensing data, and normal or abnormality is judged for operation data of the apparatus that is collected successively.

As for abnormality detection based on the outlier detection techniques, when evaluation data is deviated from data at a normal time, it is possible to detect the evaluation data as abnormality. Therefore, it is possible to perform abnormality detection only if normal data exists. That is, it is possible to perform abnormality detection theoretically even when amount of failure data is small, or failure data does not exist at all. Based on the above, it is considered to be an effective method for detection and prediction of an unknown failure.

CITATION LIST

Patent Literature

Patent Literature 1: JP 2012-155361 A

SUMMARY OF INVENTION

Technical Problem

Abnormality detection based on an outlier detection technique is a method making it possible to judge normal or abnormality if normal data exists. However, only by applying abnormality detection based on the outlier detection technique in a conditional manner, it is impossible to guess more than binary information of normal or abnormality. Therefore, it is necessary to perform failure judgment or factor clarification by examination by engineers as to what kind of abnormality occurs.

Further, various abnormality patterns occur in a target apparatus. There is a case wherein only by applying an outlier detection method in accordance with a certain algorithm, abnormality that does not follow the algorithm cannot be detected. Since detection algorithms are different from method to method in the outlier detection techniques, abnormality patterns for which detection fail are also considered to be different from method to method; hence, it is difficult to select a most suitable method.

The present invention is aimed at making it possible to suitably detect abnormality, and making it easy to specify what kind of abnormality occurs.

Solution to Problem

An abnormality detection device according to one aspect of the present invention includes:

a deviation inclination calculation unit to calculate a deviation score by using evaluation data that is obtained from a subject apparatus as an input, in each of a plurality of outlier detection methods to specify data that is deviated from other data from among subject data, and to calculate a deviation score indicating a deviation degree of the data specified, and to calculate deviation inclination information from the deviation score calculated, and an abnormality detection unit to calculate, for each of a plurality of abnormality patterns, a similarity degree between deviation sensitivity information indicating a sensitivity for each of the plurality of abnormality patterns with respect to each of the plurality of outlier detection methods, and the deviation inclination information calculated by the deviation inclination calculation unit, and to detect an abnormality of the subject apparatus.

Advantageous Effects of Invention

In the present invention, a degree of similarity between deviation sensitivity information and deviation inclination information is calculated for each abnormality pattern. This makes it possible to suitably detect abnormality, and to easily specify what kind of abnormality occurs.

BRIEF DESCRIPTION OF DRAWINGS

FIG. 6 is an explanatory drawing of an operation data acquisition process according to the first embodiment;

FIG. 9 is a diagram illustrating a form 1 of deviation sensitivity information according to the first embodiment;

FIG. 10 is a drawing illustrating a form 2 of the deviation sensitivity information according to the first embodiment;

FIG. 11 is a diagram illustrating a form 3 of the deviation sensitivity information according to the first embodiment;

FIG. 12 is a diagram illustrating a form 4 of the deviation sensitivity information according to the first embodiment;

DESCRIPTION OF EMBODIMENTS

First Embodiment

\*\*\*Description of Configuration\*\*\*

Figure 1:
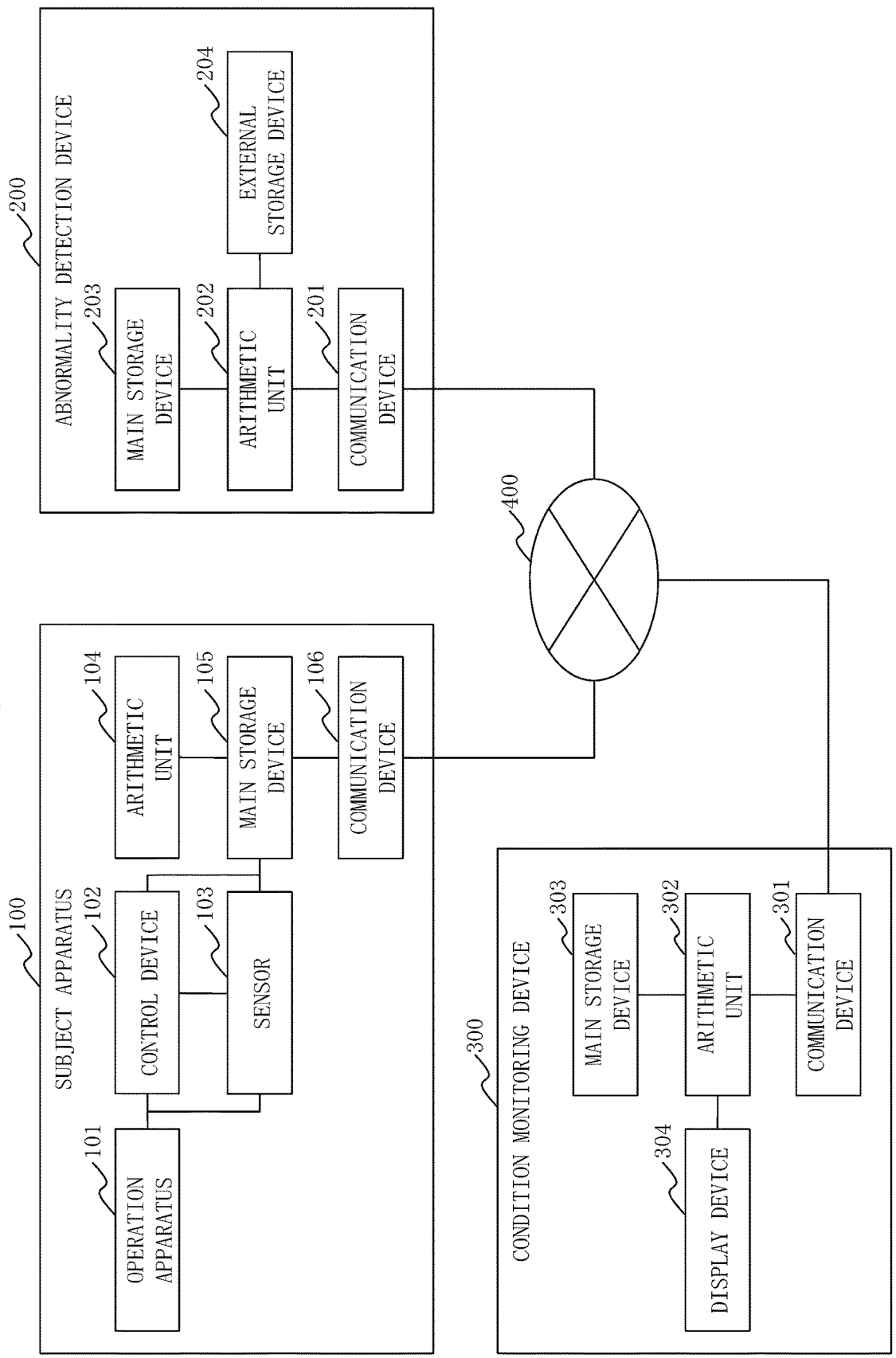
FIG. 1 is a diagram of a hardware configuration of an abnormality detection system 1 according to a first embodiment.

With reference to FIG. 1, a hardware configuration of an abnormality detection system 1 according to a first embodiment will be described.

The abnormality detection system 1 is equipped with a target apparatus 100, an abnormality detection device 200 and a condition monitoring device 300. The target apparatus 100, the abnormality detection device 200 and the condition monitoring device 300 are connected via a network 400 such as a local area network (LAN). The abnormality detection device 200 and the condition monitoring device 300 may be substantial servers, or may be configured by a cloud. The network 400 may be a virtual network.

The target apparatus 100 is a device being a target of abnormality detection.

The target apparatus 100 is equipped with hardware components of an operation apparatus 101, a control device 102, a sensor 103, an arithmetic unit 104, a main storage device 105 and a communication device 106.

The operation apparatus 101 is a part being a target of abnormality detection. The operation apparatus 101 is an apparatus such as an electric generator or an elevator, etc., as a specific example.

The control device 102 controls the operation apparatus 101. The control device 102 is a microcomputer, as a specific example.

The sensor 103 senses an operating condition of the operation apparatus 101. The sensor 103 is a temperature sensor, a pressure sensor or an optical sensor, as a specific example.

The arithmetic unit 104 is an integrated circuit (IC) to perform processing, which performs a process to transmit operation data obtained by sensing by the sensor 103 to the abnormality detection device 200. The arithmetic unit 104 may include and transmit control information of the control device 102 in the operation data. The arithmetic unit 104 is a central processing unit (CPU), a digital signal processor (DSP) or a graphics processing unit (GPU), as a specific example.

The main storage device 105 temporarily stores the control information and the operation data. The main storage device 105 is a static random access memory (SRAM) or a dynamic random access memory (DRAM), as a specific example.

The communication device 106 transmits the control information and the operation data to the abnormality detection device 200 following the process by the arithmetic unit 104. The communication device 106 is an Ethernet (registered trademark) board or a universal serial bus (USB) board, as a specific example.

The abnormality detection device 200 is a device to perform abnormality detection of the target apparatus 100.

The abnormality detection device 200 is equipped with a communication device 201, an arithmetic unit 202, a main storage device 203 and an external storage device 204.

The communication device 201 receives the control information and the operation data from the target apparatus 100. Further, the communication device 201 transmits a result of abnormality detection to the condition monitoring device 300. The communication device 201 is, as a specific example, an Ethernet (registered trademark) board or a USB board.

The arithmetic unit 202 executes processes related to abnormality detection. The arithmetic unit 202 is, as a specific example, a CPU, a DSP or a GPU.

The main storage device 203 temporarily stores processing results of the processes executed by the arithmetic unit 202. The main storage device 203 is, as a specific example, an SRAM or a DRAM.

The external storage device 204 saves various types of data. The external storage device 204 is, as a specific example, a hard disk drive (HDD). Further, the external storage device 204 may be a portable recording medium such as a secure digital (SD, registered trademark) memory card, a CompactFlash (CF, registered trademark), a NAND flash memory, a flexible disk, an optical disk, a compact disk, a Blue-ray (registered trademark) disk, or a digital versatile disk (DVD).

The condition monitoring device 300 is a device to output data indicating abnormality detected by the abnormality detection device 200. The condition monitoring device 300 is, as a specific example, a device such as a monitoring device of a monitoring center or a personal computer (PC) owned by a user.

The condition monitoring device 300 is equipped with a communication device 301, an arithmetic unit 302, a main storage device 303 and a display device 304.

The communication device 301 receives results of abnormality detection from the abnormality detection device 200. The communication device 301 is an Ethernet (registered trademark) board or a USB board, as a specific example.

The arithmetic unit 302 performs a process of result output. The arithmetic unit 302 is a CPU, a DSP or a GPU, as a specific example.

The main storage device 303 temporarily stores processing results of the process performed by the arithmetic unit 302. The main storage device 303 is an SRAM or a DRAM, as a specific example.

The display unit 304 performs result output. As a specific example, the display unit 304 is a liquid crystal display (LCD).

Figure 2:
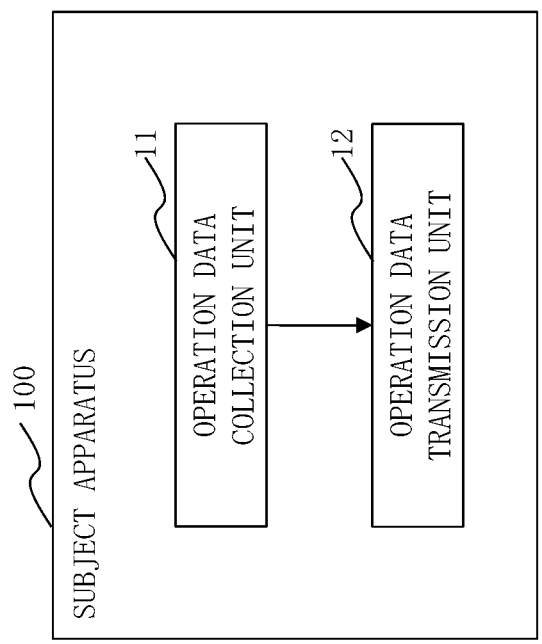
FIG. 2 is a diagram of a functional configuration of a target apparatus 100 according to the first embodiment.

With reference to FIG. 2, a functional configuration of the target apparatus 100 according to the first embodiment will be described.

The target apparatus 100 is equipped with an operation data collection unit 11 and an operation data transmission unit 12, as functional components.

The functions of the operation data collection unit 11 and the operation data transmission unit 12 are realized by software. The functions are realized by the arithmetic unit 104 through reading and executing a program to realize the functions of the operation data collection unit 11 and the operation data transmission unit 12.

Figure 3:
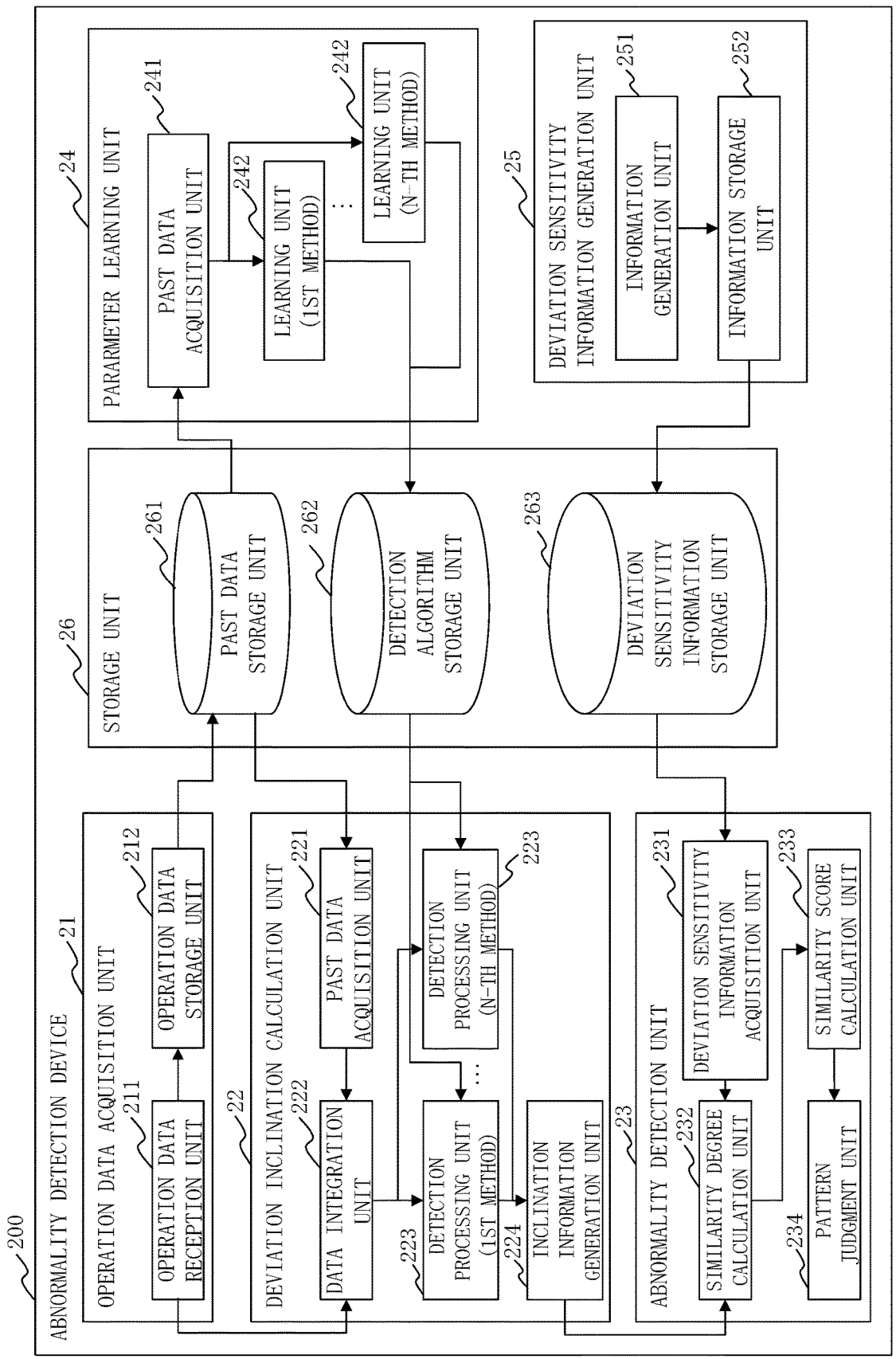
FIG. 3 is a diagram of a functional configuration illustrating an abnormality detection device 200 according to the first embodiment.

With reference to FIG. 3, the functional configuration of the abnormality detection device 200 according to the first embodiment are described.

The abnormality detection device 200 is equipped with, as functional components, an operation data acquisition unit 21, a deviation inclination calculation unit 22, an abnormality detection unit 23, a parameter learning unit 24, a deviation sensitivity information generation unit 25 and a storage unit 26.

The functions of the operation data acquisition unit 21, the deviation inclination calculation unit 22, the abnormality detection unit 23, the parameter learning unit 24 and the deviation sensitivity information generation unit 25 are realized by software. The functions are realized by the arithmetic unit 202 through reading and executing a program to realize the functions of the operation data acquisition unit 21, the deviation inclination calculation unit 22, the abnormality detection unit 23, the parameter learning unit 24 and the deviation sensitivity information generation unit 25. The program to realize the functions of the functional components of the target apparatus 100 is stored in the external storage device 204.

The functions of the storage unit 26 are realized by the external storage device 204.

The operation data acquisition unit 21 is equipped with an operation data reception unit 211 and an operation data storage unit 212.

The deviation inclination calculation unit 22 is equipped with a past data acquisition unit 221, a data integration unit 222, a detection processing unit 223 and an inclination information generation unit 224. The detection processing unit 223 includes processing blocks for each deviation detection method. In FIG. 1, the detection processing unit 223 includes processing blocks corresponding to N pieces of methods from a first method through an N-th method.

The abnormality detection unit 23 is equipped with a deviation sensitivity information acquisition unit 231, a similarity degree calculation unit 232, a similarity score calculation unit 233 and a pattern judgment unit 234.

The parameter learning unit 24 is equipped with a past data acquisition unit 241 and a learning unit 242. The learning unit 242 includes processing blocks for each deviation detection method. In FIG. 1, the learning unit 242 includes processing blocks corresponding to N pieces of methods from a first method through an N-th method, similarly to the detection processing unit 223.

The deviation sensitivity information generation unit 25 is equipped with an information generation unit 251 and an information storage unit 252.

The storage unit 26 is equipped with a past data storage unit 261, a detection algorithm storage unit 262 and a deviation sensitivity information storage unit 263.

Figure 4:
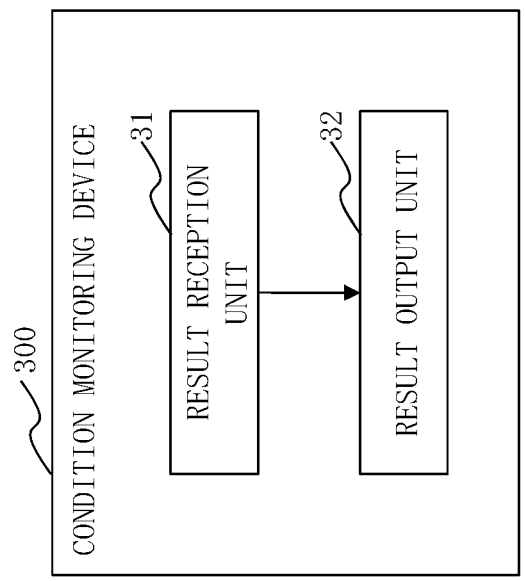
FIG. 4 is a diagram of a functional configuration illustrating a condition monitoring device 300 according to the first embodiment.

With reference to FIG. 4, a functional configuration of the condition monitoring device 300 according to the first embodiment will be described.

The condition monitoring device 300 is equipped with a result reception unit 31 and a result output unit 32, as functional components.

The functions of the result reception unit 31 and the result output unit 32 are realized by software. The functions are realized by the arithmetic unit 302 through reading and executing a program to realize the functions of the result reception unit 31 and the result output unit 32.

With reference to FIG. 5 through FIG. 13, the operation of the abnormality detection system 1 according to the first embodiment will be described.

The operation of the abnormality detection system 1 according to the first embodiment corresponds to an abnormality detection method according to the first embodiment. Further, the operation of the abnormality detection system 1 according to the first embodiment corresponds to processing of an abnormality detection program according to the first embodiment.

Figure 5:
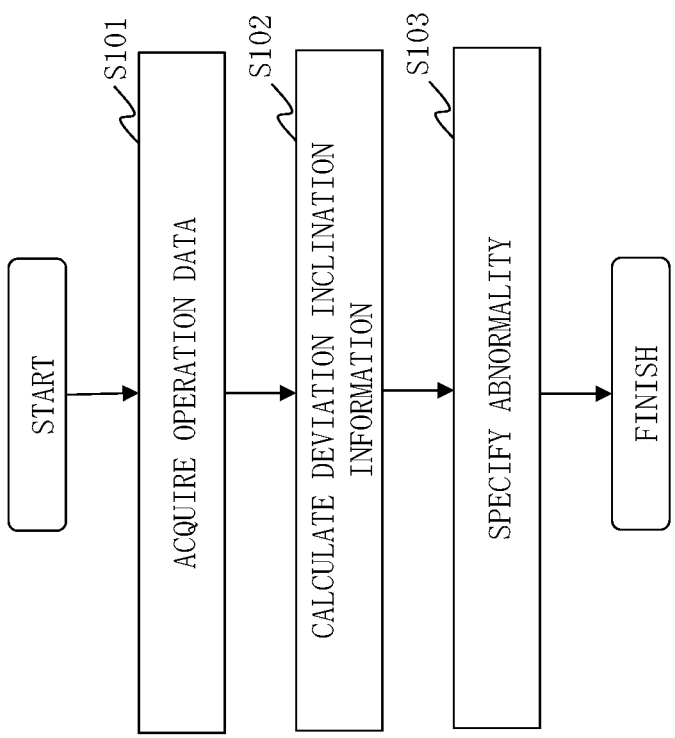
FIG. 5 is a flowchart of an abnormality detection process according to the first embodiment.

With reference to FIG. 5, an abnormality detection process according to the first embodiment will be described.

The abnormality detection process is a process to detect abnormality of the target apparatus 100. The abnormality detection process is performed by the target apparatus 100, the operation data acquisition unit 21, the deviation inclination calculation unit 22 and the abnormality detection unit 23 of the abnormality detection device 200, and the condition monitoring device 300. The abnormality detection process may be performed at an arbitrary timing, or may be performed periodically.

(Step S101: Operation Data Acquisition Process)

In the target apparatus 100, operation data is acquired by the sensor 103 during operation of the operation apparatus 101 based on control by the control device 102. The operation data collection unit 11 collects the operation data acquired and write the operation data in the main storage device 105. The operation data transmission unit 12 transmits operation data of a certain period of time collected by the operation data collection unit 11 to the abnormality detection device 200 via the communication device 106.

The operation data acquisition unit 21 of the abnormality detection device 200 acquires the operation data transmitted by the operation data transmission unit 12 via the communication device 201. The operation data acquisition unit 21 writes the operation data acquired in the main storage device 203.

(Step S102: Deviation Inclination Calculation Process)

The deviation inclination calculation unit 22 of the abnormality detection device 200 calculates deviation inclination information for the operation data acquired in the step S101.

Specifically, the deviation inclination calculation unit 22 calculates a deviation score by using as an input evaluation data obtained from the target apparatus 100, by each of a plurality of outlier detection methods to specify data deviated from other data from among target data, and to calculate deviation scores indicating degrees of deviation of the data specified. The deviation inclination calculation unit 22 generates deviation inclination information from the deviation scores calculated. The deviation inclination calculation unit 22 writes the deviation inclination information calculated in the main storage device 203.

(Step S103: Abnormality Specification Process)

The abnormality detection unit 23 of the abnormality detection device 200 judges whether abnormality exists, and specifies a presumed abnormality pattern when abnormality exists, based on the deviation inclination information calculated in the step S102.

Specifically, the abnormality detection unit 23 detects abnormality in the target apparatus 100 by calculating, for each abnormality pattern, a similarity degree between deviation sensitivity information indicating sensitivity for each of the plurality of abnormality patterns with respect to each of the plurality of outlier detection methods, and the deviation inclination information calculated in the step S102. The abnormality detection unit 23 transmits the detection result to the condition monitoring device 300 via the communication device 201.

The result reception unit 31 of the condition monitoring device 300 receives the detection result transmitted by the abnormality detection unit 23 via the communication device 301. The result output unit 32 outputs the detection result received by the result reception unit 31 to the display device 304.

With reference to FIG. 6, an operation data acquisition process (step S101 in FIG. 5) according to the first embodiment will be described.

The operation data reception unit 211 receives the operation data transmitted by the operation data transmission unit 12. Then, the operation data reception unit 211 performs data processing for deviation inclination information calculation on the operation data received. Then, the operation data storage unit 212 stores the operation data processed in the past data storage unit 261.

It is here assumed that operation data transmitted at once at a time t is data cut to a time length m (=from a time t-m until the time t), which is called operation data at the time t. It is assumed that sensing is performed L times at regular intervals in the time length m. Further, the number of variables of operation data at the time t is assumed to be k. The number of variables is the number of data columns determined by the number of sensors, etc. Therefore, it is possible to handle operation data to be transmitted at once at the time t as L k matrix data wherein data measurement times are arranged in a row direction, and data of each variable is arranged in a column direction. Then, the operation data reception unit 211 processes the operation data received into L×k matrix data.

When operation data of a target apparatus is time series data of one variable, it is possible to handle the time series data similarly as in a case of multivariate data, by rearranging and handling the data cut to the time length m into L×k matrix data. In this regard, it is assumed that the number of pieces of data of the time series data of one variable in the time length m is equal to L k. As described above, by dividing data to a prescribed time length (k, for example) when time series data is included in target data, and handling the data divided as k pieces of multivariate data, it is possible to handle irrelevantly time series data and multivariate data at the same time. In this regard, when time series data is data having periodicity, data of one cycle needs to correspond to the time length (k, for example) of division.

Figure 7:
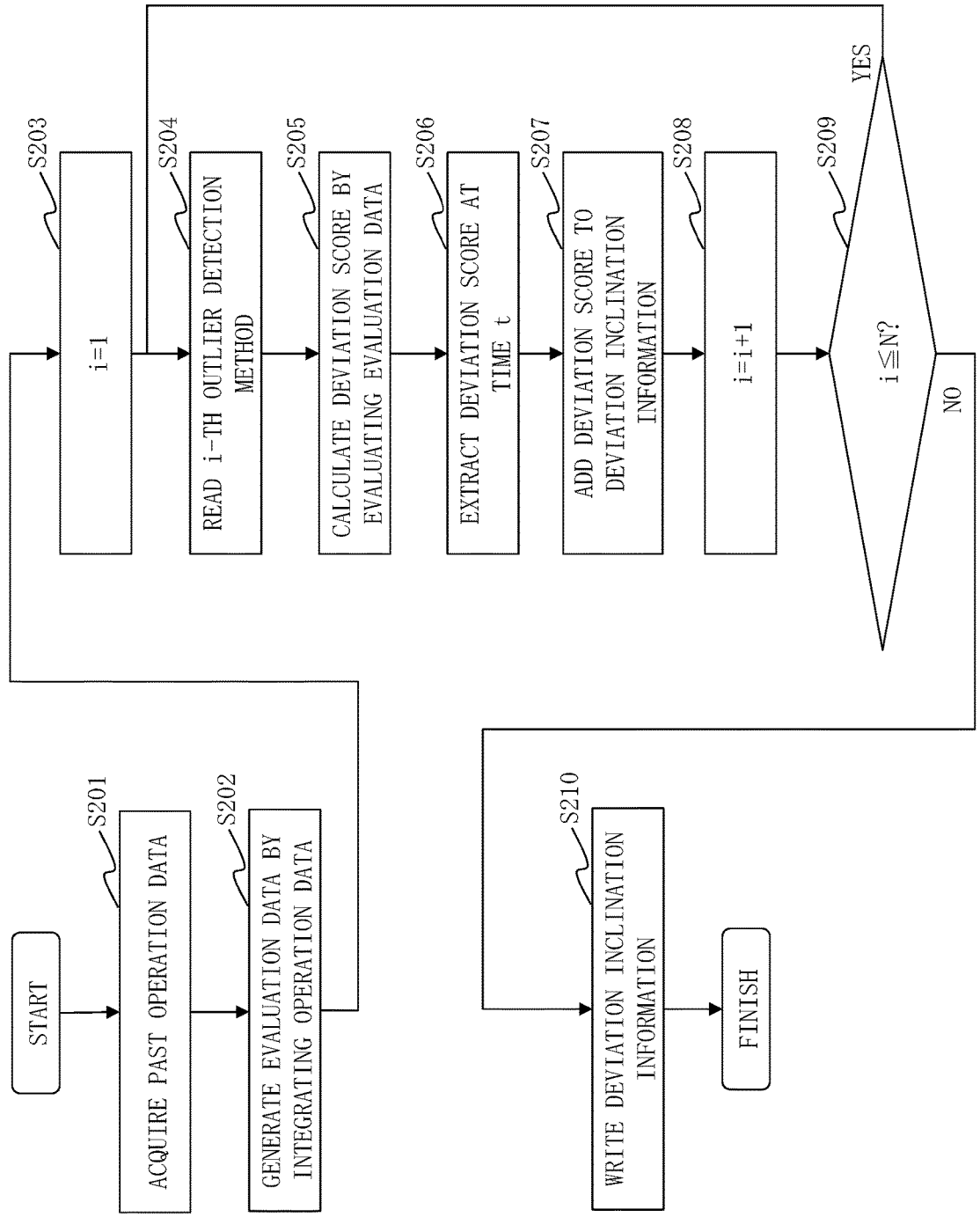
FIG. 7 is a flowchart of a deviation inclination calculation process according to the first embodiment.

With reference to FIG. 7, a deviation inclination calculation process (step S102 of FIG. 5) according to the first embodiment will be described.

In a step S201, the past data acquisition unit 221 acquires past operation data stored in the past data storage unit 261. The past data acquisition unit 221 writes the past operation data acquired in the main storage device 203.

In a step S202, the data integration unit 222 reads the operation data at the time t acquired in the step S101, and the past operation data acquired in the step S201, from the main storage device 203. The data integration unit 222 integrates the operation data at the time t with the past operation data, and generates evaluation data. The data integration unit 222 writes the evaluation data generated in the main storage device 203.

Next, from a step S203 through a step S209, calculation processing of a deviation score is repeatedly performed the number of times N of the outlier detection methods.

In the step S203, the detection processing unit 223 initializes the value of a counter i to 1. In the step S204, the detection processing unit 223 reads out an algorithm of the i-th outlier detection method from the detection algorithm storage unit 262. In the step S205, the detection processing unit 223 reads out the evaluation data from the main storage device 203, performs an outlier detection process for the evaluation data by the algorithm of the i-th outlier detection method, and calculates a deviation score. In the step S206, the detection processing unit 223 extracts, from the deviation score calculated in the step S205, only a deviation score for operation data at the time t being an evaluation time period. In the step S207, the detection processing unit 223 adds the deviation score extracted in the step S206 to deviation inclination information St(i). In the step S208, the detection processing unit 223 adds 1 to a value of the counter i. In the step S209, the detection processing unit 223 judges whether the value of the counter i is equal to or smaller than the number N of the outlier detection methods, or not.

When the value of the counter i is equal to or smaller than the number N of the outlier detection methods, the detection processing unit 223 returns the procedure to the step S204, and calculates a deviation score by the next outlier detection method. Meanwhile, the detection processing unit 223 proceeds with the procedure to a step S210 when the value of the counter i is larger than the number N of the outlier detection methods.

In the step S210, the inclination information generation unit 224 writes in the main storage device 203 the deviation inclination information St wherein the deviation score is set in the step S206, as deviation inclination information of the operation data at the time t.

The deviation score calculated in the step S206 and the deviation inclination information confirmed in the step S210 will be described.

When the operation data at the time t is L k matrix data, the deviation score is calculated for the number of rows L. Scores of each row is binary information of normal or abnormality. When being handled as the deviation inclination information, an abnormality judgment rate for each row is used as operation data at the time t. Specifically, when the number of abnormality scores is f, the deviation score St(i) is f/L.

Then, the deviation inclination information of the operation data at the time t confirmed in the step S210 is a column vector data St consisting of N pieces of elements wherein the deviation scores St(i) are integrated for the number of times N of the outlier detection methods. The deviation inclination information is column vector data St wherein the deviation scores St(i) are arranged in an order of the outlier detection methods (comparison order).

In the step S205, algorithms are executed by processing blocks respectively corresponding to the outlier detection methods. Specifically, the corresponding processing blocks process the evaluation data into forms corresponding to the outlier detection methods, perform outlier detection for the evaluation data, and calculate deviation scores. By configuring only parts of data processing and execution of detection algorithms for each method, it is possible to commonalize processes until generation of the evaluation data.

Figure 8:
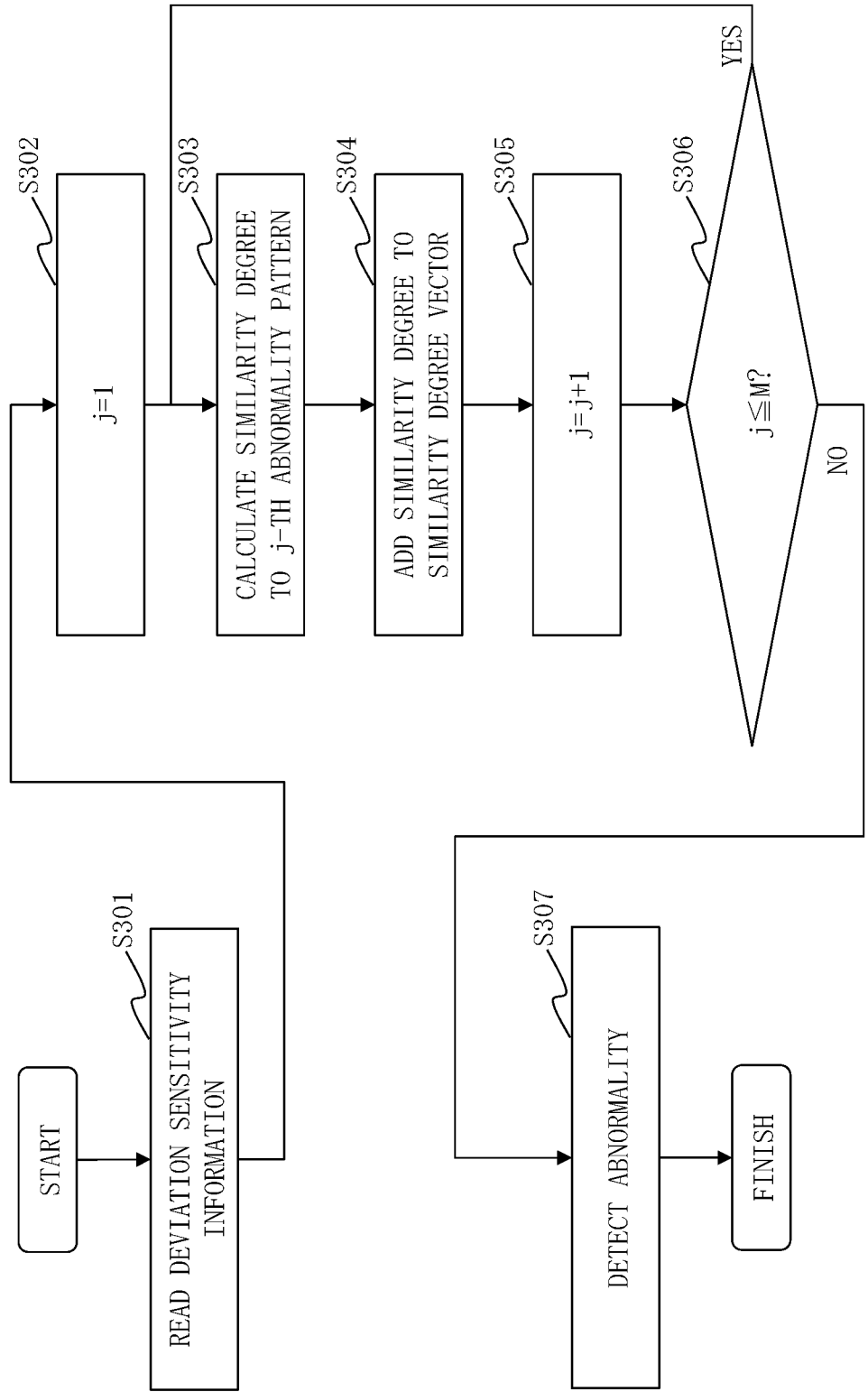
FIG. 8 is a flowchart of an abnormality specification process according to the first embodiment.

With reference to FIG. 8, an abnormality specification process (step S103 in FIG. 5) according to the first embodiment will be described.

In a step S301, the deviation sensitivity information acquisition unit 231 reads out deviation sensitivity information from the deviation sensitivity information storage unit 263. The deviation sensitivity information acquisition unit 231 writes the deviation sensitivity information read in the main storage device 203.

Next, from a step S302 through a step S306, calculation processing of a similarity degree is repeatedly performed for the number of times M of abnormality patterns of an evaluation subject.

In the step S302, the similarity degree calculation unit 232 initializes a value of a counter j to 1. In the step S303, the similarity degree calculation unit 232 reads out the deviation inclination information St calculated in the step S102, and the deviation sensitivity information read in the step S301, from the main storage device 203. The similarity degree calculation unit 232 calculates a similarity degree of the deviation inclination information St to an abnormality pattern (j) being the j-th abnormality pattern of the deviation sensitivity information. As a calculation method of the similarity degree, it is possible to use a general calculation method such as correlated calculation or norm calculation (distance calculation). In the step S304, the similarity score calculation unit 233 adds the similarity degree calculated in the step S303 to a similarity degree vector SVt(j). In the step S305, the similarity degree calculation unit 232 adds 1 to a value of the counter j. In the step S306, the similarity degree calculation unit 232 judges whether the value of the counter j is equal to or smaller than the number of abnormality patterns M, or not.

The similarity degree calculation unit 232 returns the procedure to the step 303 when the value of the counter j is equal to or smaller than the number of abnormality patterns M, and calculates a degree of similarity for a next abnormality pattern. Meanwhile, the similarity degree calculation unit 232 proceeds with the procedure to a step S307 when the value of the counter j is greater than the number of abnormality patterns M.

In the step S307, the pattern judgment unit 234 performs abnormality detection based on the similarity degree vector SVt wherein the similarity degree is set in the step S304.

Then, the pattern judgment unit 234 transmits a detection result to the condition monitoring device 300.

Specifically, the pattern judgment unit 234 detects all abnormality patterns having a similarity degree surpassing a prescribed threshold value with respect to each element of the similarity degree vector SVt, as abnormality patterns having probability of occurrence. This detection method makes it possible to detect only a case with probability of occurrence of abnormality at a certain level or more; therefore, it is expected an effect of decreasing false detection in comparison to conventional methods.

Further, the pattern judgment unit 234 may detect only an abnormality pattern having a largest similarity degree as an abnormality pattern having probability of occurrence among abnormality patterns having similarity degrees surpassing a prescribed threshold value with respect to each element of the similarity degree vector SVt. According to this detection method, it is possible to estimate a most probable abnormality pattern from among abnormality patterns having probability of occurrence of abnormality at a certain level of more. Therefore, it is possible to perform detection wherein the cause of abnormality is narrowed down.

According to any of these detection methods, the pattern judgment unit 234 specifies an abnormality pattern with a high similarity degree with respect to the operation condition calculated from the operation data at the time t, i.e., an abnormality pattern with high probability of occurrence. Then, the pattern judgment unit 234 transmits to the condition monitoring device 300 whether an abnormality pattern whose similarity degree is equal to or more than a threshold value or not, and the abnormality pattern specified, as a detection result.

With reference to FIG. 9 through FIG. 12, deviation sensitivity information according to the first embodiment will be described.

The deviation sensitivity information is information wherein sensitivity to each abnormality pattern of various outlier detection methods is arranged systematically. When the number of outlier detection methods used is N, and the number of abnormality patterns is M, the deviation sensitivity information is retained as N×M matrix data. The data of an n-th row and an m-th column of the deviation sensitivity information represents sensitivity to an m-th abnormality pattern (abnormality pattern (m)) of an n-th outlier detection method algorithm (outlier detection method (n)). It is represented the higher the value of sensitivity is, the higher abnormality detection ability with respect to the abnormality pattern (m) using the outlier detection method (n) is. "The abnormality detection ability is high" means that abnormality detection can be easily performed.

The deviation sensitivity information is retained as N M matrix data. Therefore, an abnormality pattern (j) being a j-th abnormality pattern of the deviation sensitivity information in the process of the step S303 in FIG. 8 is a j-th column data of the deviation sensitivity information. Therefore, the abnormality pattern (j) is column vector data consisting of N pieces of elements, N being the number of the outlier detection methods. In the abnormality pattern (j), sensitivity is arranged in an order (comparison order) of the outlier detection methods same as in the deviation inclination information.

The abnormality pattern may be a manner of deviation of data based on a physical phenomenon, or may be a manner of deviation that may occur simply as number sequence data.

For example, the former is noise superposition due to deterioration in a signal transmission route, and the latter is an amplitude increase change of time-series data. When it is identified what kind of failure occurs as a physical phenomenon, and as what kind of features the failure appears in data, by organizing that information in the deviation sensitivity information, it becomes possible to estimate an abnormality cause easily when the abnormality actually occurs. Meanwhile, even when a physical phenomenon cannot be identified, since it is possible to estimate an abnormality pattern, it is possible to easily perform cause refinement and cause analysis of the abnormality or the failure.

Further, it is possible for a user to arbitrarily select an outlier detection method to be selected, and an information retaining method of an abnormality pattern desired to detect. Generally, all abnormality patterns that may occur in sensing data of apparatus operations (physical phenomenon), and a combination of all outlier detection methods that are capable of detecting at least one of the abnormality patterns that may occur are retained in the deviation sensitivity information. This makes it possible to detect abnormality of all abnormality patterns, and to perform estimation of an abnormality pattern. With respect to the sensitivity of a specific abnormality pattern for a specific outlier detection method, a performance value (true positive ratio or precision ratio, etc.) of detection accuracy in a case wherein a specific outlier detection method is applied to past data may be adopted, or a user may arbitrarily set the sensitivity.

Furthermore, when it is proved beforehand that what kind of abnormality pattern occurs for operation data of a subject apparatus, it may be applicable to extract only a minimum required combination from combinations of all abnormality patterns and all outlier detection methods prepared beforehand, and to re-edit a deviation detection table. This makes it possible to execute abnormality detection efficiently.

Further, when some kind of abnormality occurs in the subject apparatus 100, the abnormality is not necessarily be a single abnormality due to a single cause at a single part. Instead, in many cases, a plurality of abnormalities coincide with one another, to be expressed as one abnormality pattern. Therefore, it is supposed a variation of abnormality patterns for the number of all combinations of single abnormality patterns due to single causes. That is, when the number of single abnormality patterns is supposed to be P patterns, it is necessary to suppose up to $2^P$ patterns of abnormalities.

In FIG. 9 through FIG. 12, examples of information retaining methods of the deviation sensitivity information are illustrated.

For the expression of sensitivity with respect to an outlier detection method (n) and an abnormality pattern (m), there are binary expression form (form 1) where good sensitivity or poor sensitivity is expressed binary, as illustrated in FIG. 9, and a level expression form wherein good sensitivity or poor sensitivity is expressed in levels by real numbers of [0, 1], as illustrated in FIG. 10 through FIG. 12.

As for the level expression form, there are a form 2 wherein each data of N M matrix is represented by real numbers of [0, 1] as illustrated in FIG. 9, a form 3 wherein a total value is standardized to be one for each abnormality pattern (column direction of N<M matrix) as illustrated in FIG. 10, and a form 4 wherein a total value is standardized to be one for each outlier detection method (row direction of N×M matrix) as illustrated in FIG. 11. In other words, the form 2 is a form to independently retain sensitivity to the outlier detection method (n) and the abnormality pattern (m). The form 3 is a form to represent superiority or inferiority of sensitivity of each outlier detection method with respect to each abnormality pattern. The form 4 is a form to represent superiority or inferiority of sensitivity of each abnormality pattern with respect to each outlier detection method. It is possible for a user to arbitrarily select which form to select.

It is assumed here that the level expression is performed by the real numbers of [0, 1]; however, a range of values that real numbers can take is not limited to [0, 1], but may be a certain reference range. When the reference range is [0, reference value], in the forms 3 and 4, it is only necessary to standardize the total values so as to become the reference values.

Figure 13:
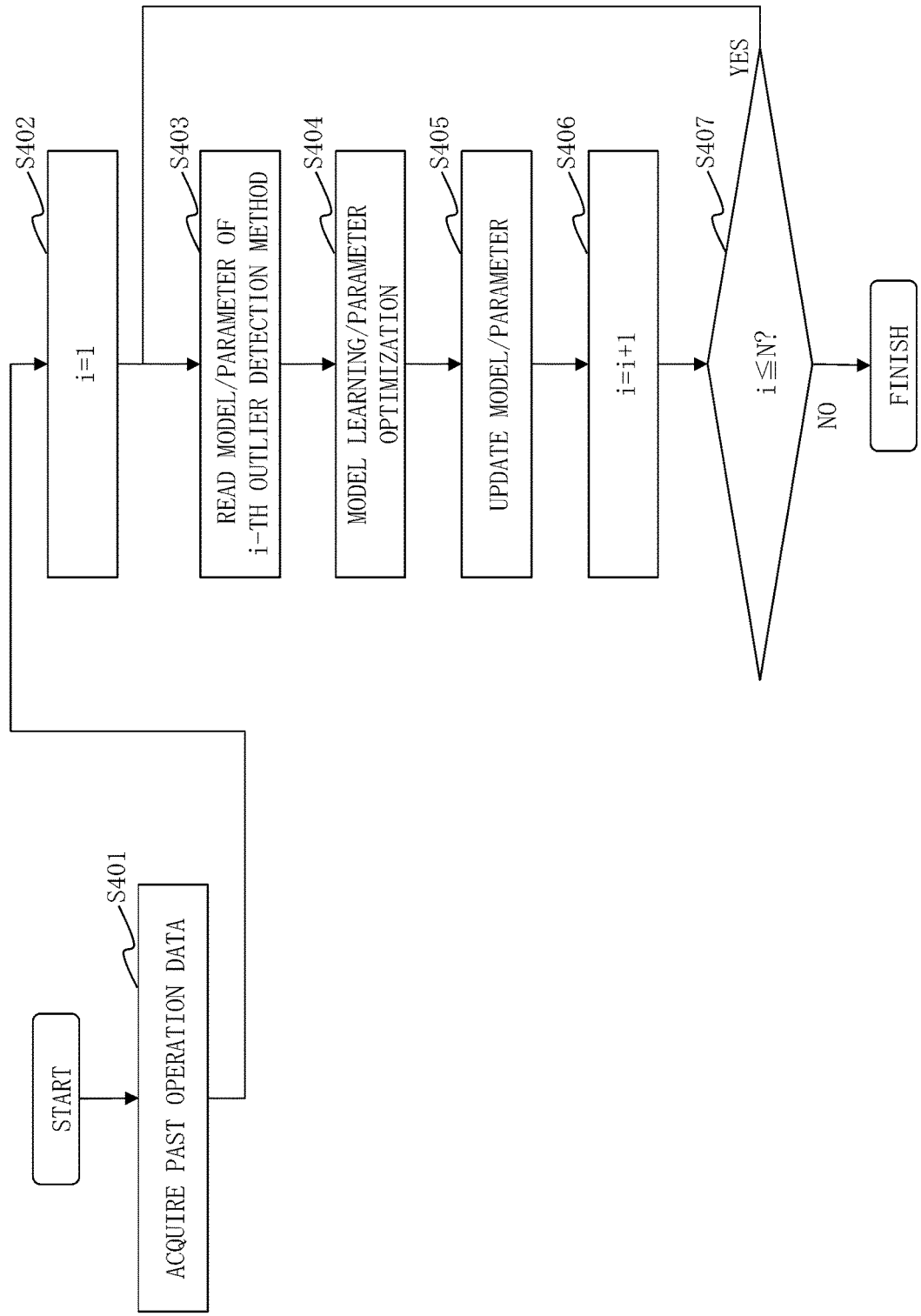
FIG. 13 is a flowchart of a learning process according to the first embodiment.

With reference to FIG. 13, a learning process according to the first embodiment will be described.

The learning process is a process to perform at least any of model learning and parameter optimization of each outlier detection method. The learning process is performed on an irregular base at long-term intervals of one year, for example.

In a step S401, the past data acquisition unit 241 acquires past operation data stored in the past data storage unit 261 as learning data. The past data acquisition unit 241 writes the leaning data acquired in the main storage device 203.

Next, in a step S402 through a step S407, at least any process of model learning and parameter optimization is repeatedly performed for the number of times N of outlier detection methods.

In the step S402, the learning unit 242 initializes the counter i to 1. In the step S403, the learning unit 242 extracts at least any of a current model and a current parameter of the outlier detection method (i). In a step S404, the learning unit 242 reads out the learning data from the main storage device 203, and performs at least any of model learning and parameter optimization with the learning data. In a step S405, when model learning is performed in the step S404, the learning unit 242 updates a model in the detection algorithm storage unit 262 with the model learned. When parameter optimization is performed in the step S404, the learning unit 242 updates a parameter in the detection algorithm storage unit 262 with the parameter optimized. In the step S406, the learning unit 242 adds 1 to the value of the counter i. In the step S407, the learning unit 242 judges whether the number of the counter i is equal to or smaller than the number N of the outlier detection methods, or not.

When the value of the counter i is equal to or smaller than the number N of the outlier detection methods, the learning unit 242 returns the procedure to the step S403, and performs the process for a next outlier detection method. Meanwhile, when the value of the counter i is larger than the number N of the outlier detection methods, the detection processing unit 223 finishes the procedure.

The frequency to perform the learning process influences abnormality detection precision. When the abnormality detection precision reaches a level that satisfies a user, it is unnecessary to perform the learning process. Therefore, for example, it may be applicable to update a model at relatively high frequency at the beginning of introduction of the abnormality detection device 200, and to stop updating after update has been performed and precision is improved to a certain degree.

Further, in many cases, necessity of model learning and necessity of parameter optimization differ from outlier detection method to outlier detection method that is selected. Therefore, there is a case wherein it is unnecessary to perform model learning and parameter optimization for all outlier detection methods at once. In such a case, it may be applicable to perform the learning process only for a specific outlier detection method.

Figure 14:
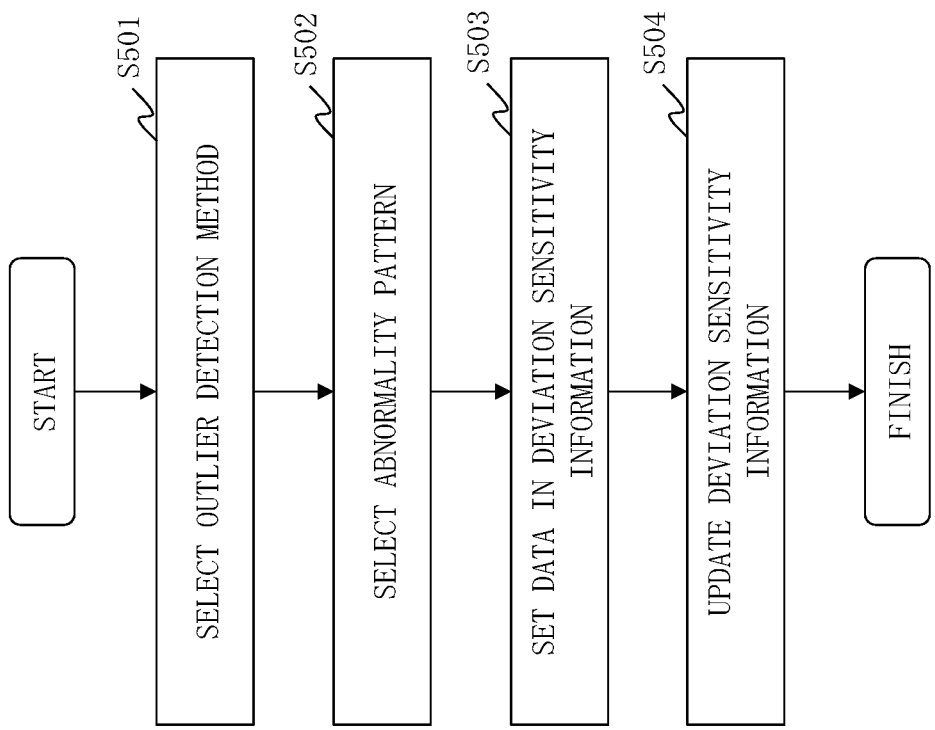
FIG. 14 is a flowchart of a deviation sensitivity information generation process according to the first embodiment.

With reference to FIG. 14, a deviation sensitivity information generation process according to the first embodiment will be described.

The deviation sensitivity information generation process is a process to generate deviation sensitivity information used in the abnormality specification process (step S103 in FIG. 5). The deviation sensitivity information generation process needs to be performed at least once before execution of the abnormality specification process. The deviation sensitivity information generation process is performed on an irregular base at long-term intervals of one year, for example, similarly to the learning process.

In a step S501, the information generation unit 251 selects an outlier detection method being a subject. In a step S502, the information generation unit 251 selects an abnormal pattern being a subject. In a step S503, the information generation unit 251 sets data in columns corresponding to the detection method selected in the step S501, and the abnormality pattern selected in the step S502, in the deviation sensitivity information, and generates new deviation sensitivity information. In a step S504, the information storage unit 252 updates deviation sensitivity information stored in the deviation sensitivity information storage unit 263 with the deviation sensitivity information generated in the step S503.

It is possible to arbitrarily change combinations of outlier detection methods used and abnormality patterns supposed even when the abnormality detection device 200 is being used. However, when the deviation sensitivity information is changed, it is necessary to perform once again the deviation sensitivity information generation process and the learning process.

Effect of First Embodiment

As described above, the abnormality detection device 200 according to the first embodiment calculates a similarity degree between deviation sensitivity information and deviation inclination information for each abnormality pattern. This makes it possible to detect abnormality suitably, and to easily specify what kind of abnormality occurs.

The abnormality detection device 200 according to the first embodiment makes good use of deviation sensitivity information being a relation table wherein sensitivity for each abnormality pattern of various outlier detection methods is arranged systematically, to realize abnormality detection and abnormality pattern estimation. This makes it possible not only to perform binary judgment of normal or abnormality similarly to existing abnormality detection using an outlier detection method, but also to analyze what kind of abnormality occurs. When an abnormality pattern is related uniquely to a failure pattern of a subject apparatus, it is easy to perform specification of a failure part.

Further, there is a possibility that it is impossible to detect a certain abnormality pattern by simply using an outlier detection method. Whereas, it is possible for the abnormality detection device 200 according to the first embodiment to reduce detection failures for any types of abnormality, by covering any types of abnormality patterns beforehand in the deviation sensitivity information.

Further, it is possible to apply the abnormality detection device 200 according to the first embodiment to each subject apparatus 100 without customizing the model beforehand. Therefore, it is possible to expect an effect of abnormality detection even for a complicated apparatus whose physical model cannot be clarified, and for an apparatus of other companies being a "black box".

\*\*\*Other Configurations\*\*\*
<First Variation>

In the first embodiment, the functions of each unit of the operation data collection unit 11, the operation data transmission unit 12, the operation data acquisition unit 21, the deviation inclination calculation unit 22, the abnormality detection unit 23, the parameter learning unit 24, the deviation sensitivity information generation unit 25, the result reception unit 31 and the result output unit 32 are realized by software. However, as a first variation, the functions of each unit above may be realized by hardware components. As for this first variation, different parts from those of the first embodiment will be described.

Figure 15:
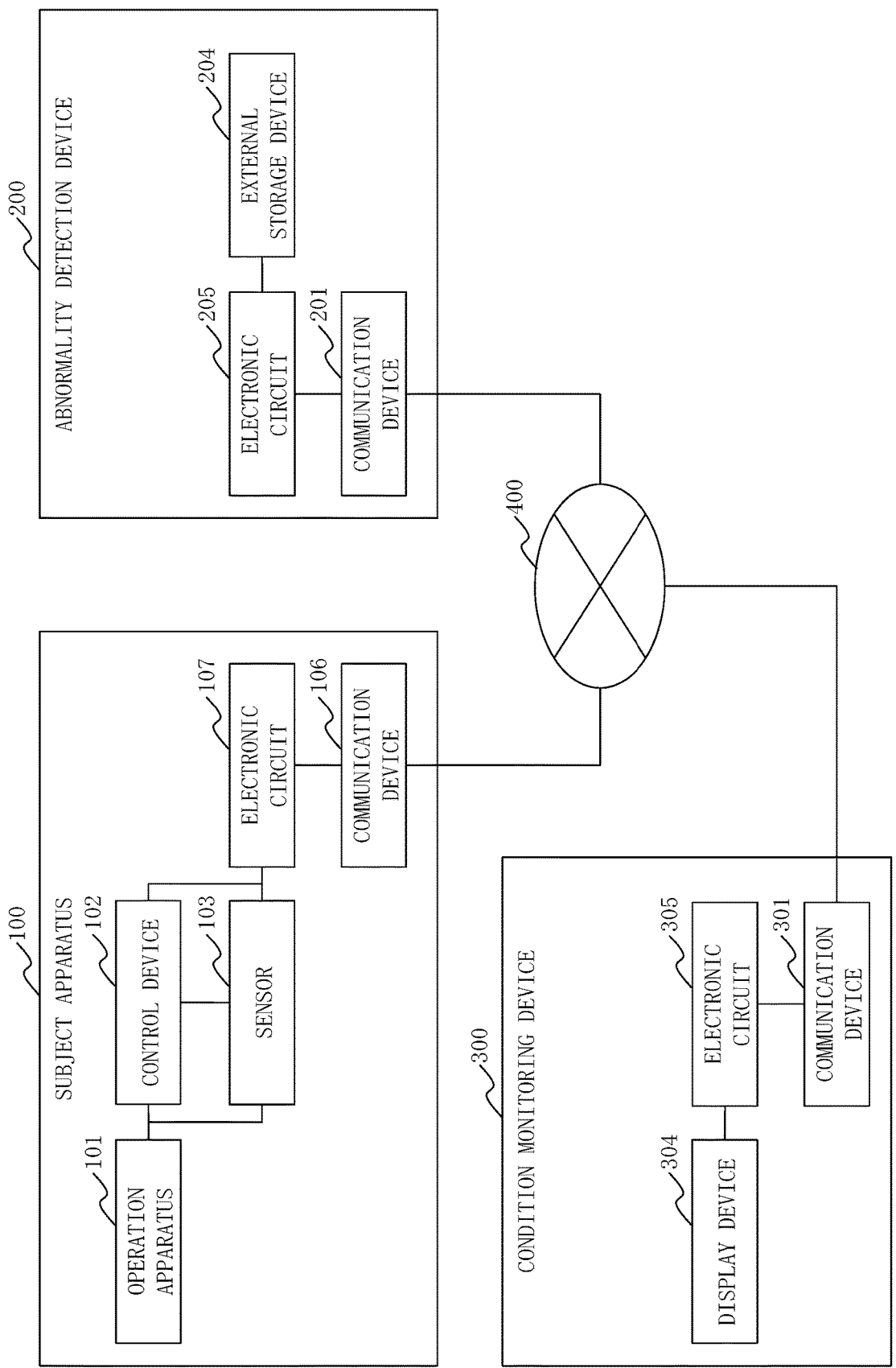
FIG. 15 is a diagram of a hardware configuration of the abnormality detection system 1 according to a first variation.

With reference to FIG. 15, a hardware configuration of an abnormality detection system 1 according to the first variation will be described.

When the functions of each unit above are realized by the hardware components, the subject apparatus 100 is equipped with an electronic circuit 107 instead of the arithmetic unit 104 and the main storage device 105. Further, the abnormality detection device 200 is equipped with an electronic circuit 205 instead of the arithmetic unit 202 and the main storage device 203. The condition monitoring device 300 is equipped with an electronic circuit 305 instead of the arithmetic unit 302 and the main storage device 303.

The electronic circuit 107 is a dedicated circuit to realize the functions of the operation data collection unit 11 and the operation data transmission unit 12, and the functions of the main storage device 105. The electronic circuit 205 is a dedicated circuit to realize the functions of the operation data acquisition unit 21, the deviation inclination calculation unit 22, the abnormality detection unit 23, the parameter learning unit 24 and the deviation sensitivity information generation unit 25, and the functions of the main storage device 203. The electronic circuit 305 is a dedicated circuit to realize the functions of the result reception unit 31 and the result output unit 32, and the functions of the main storage device 303.

As the electronic circuits 107, 205 and 305, a single circuit, a composite circuit, a processor that is made into a program, a processor that is made into a parallel program, a logic IC, a gate array (GA), an application specific integrated circuit (ASIC), and a field-programmable gate array (FPGA) are considered.

The functions of each unit above may be realized respectively by one electronic circuit 107, 205 or 305, or the functions of each unit above may be realized dispersively by a plurality of electronic circuits 107, 205 or 305.
<Second Variation>

As a second variation, a part of the functional components may be realized by hardware components, and other functional components may be realized by software.

The arithmetic units 104, 202 and 302, the main storage devices 105, 203 and 303, and the electronic circuits 107, 205 and 305 are called processing circuitry. That is, the functions of each unit above are realized by the processing circuitry.

Second Embodiment

Second Embodiment is different from the first embodiment in that the abnormality detection device 200 is divided into three devices. In the second embodiment, this different point will be described, whereas explanation on the same points is omitted.

Figure 16:
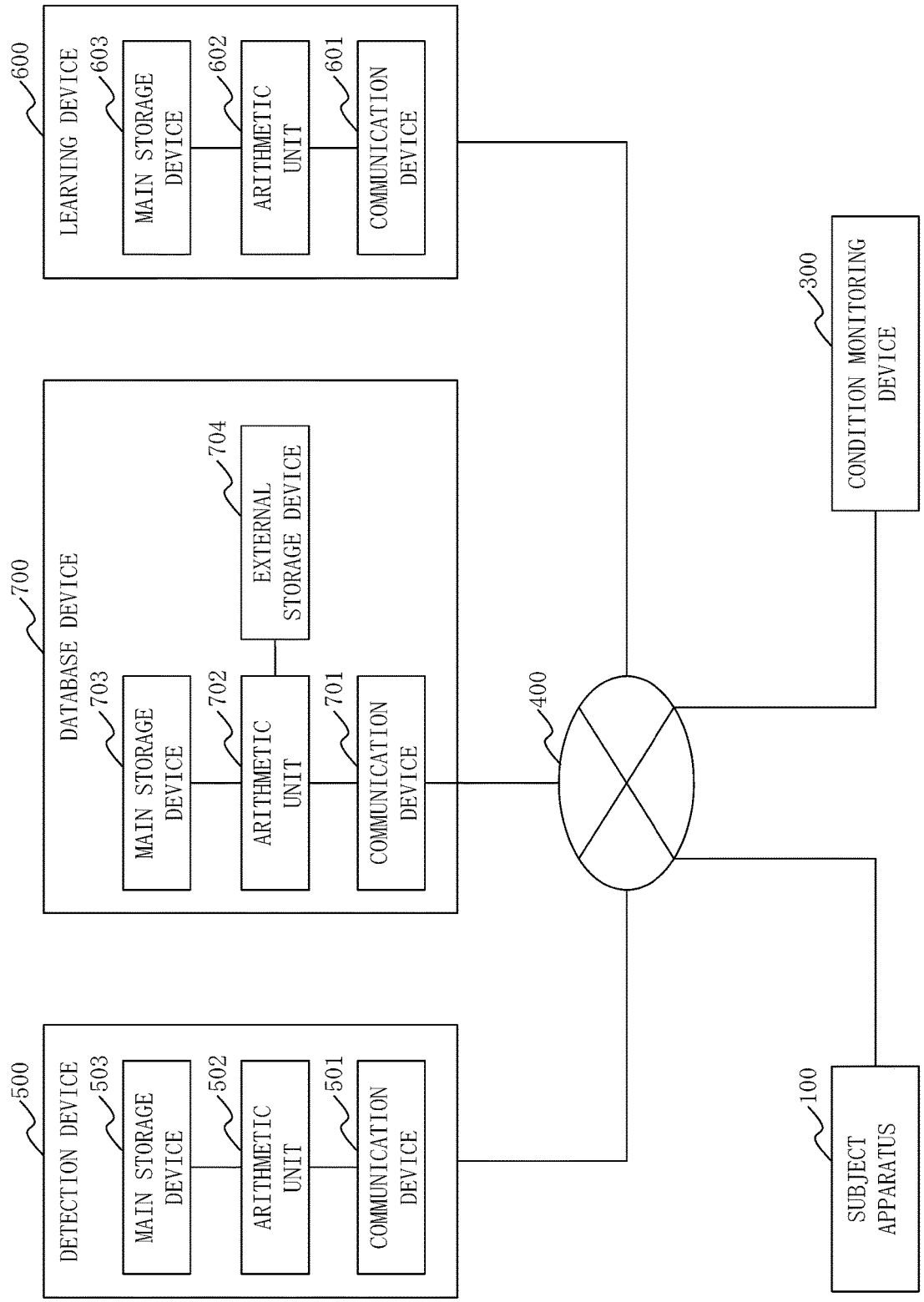
FIG. 16 is a diagram of a hardware configuration of an abnormality detection system 1 according to a second embodiment.

With reference to FIG. 16, a hardware configuration of the abnormality detection system 1 according to the second embodiment will be described. In FIG. 16, the configurations of the subject apparatus 100 and the condition monitoring device 300 are omitted.

The abnormality detection system 1 is equipped with a detection device 500, a learning device 600 and a database device 700 instead of the abnormality detection device 200, which is different from the abnormality detection system 1 illustrated in FIG. 1. The detection device 500, the learning device 600 and the database device 700 may be substantial servers, or may be configured by a cloud.

The detection device 500 is equipped with a communication device 501, an arithmetic unit 502 and a main storage device 503. The learning device 600 is equipped with a communication device 601, an arithmetic unit 602 and a main storage device 603. The database device 700 is equipped with a communication device 701, an arithmetic unit 702, a main storage device 703 and an external storage device 704.

Figure 17:
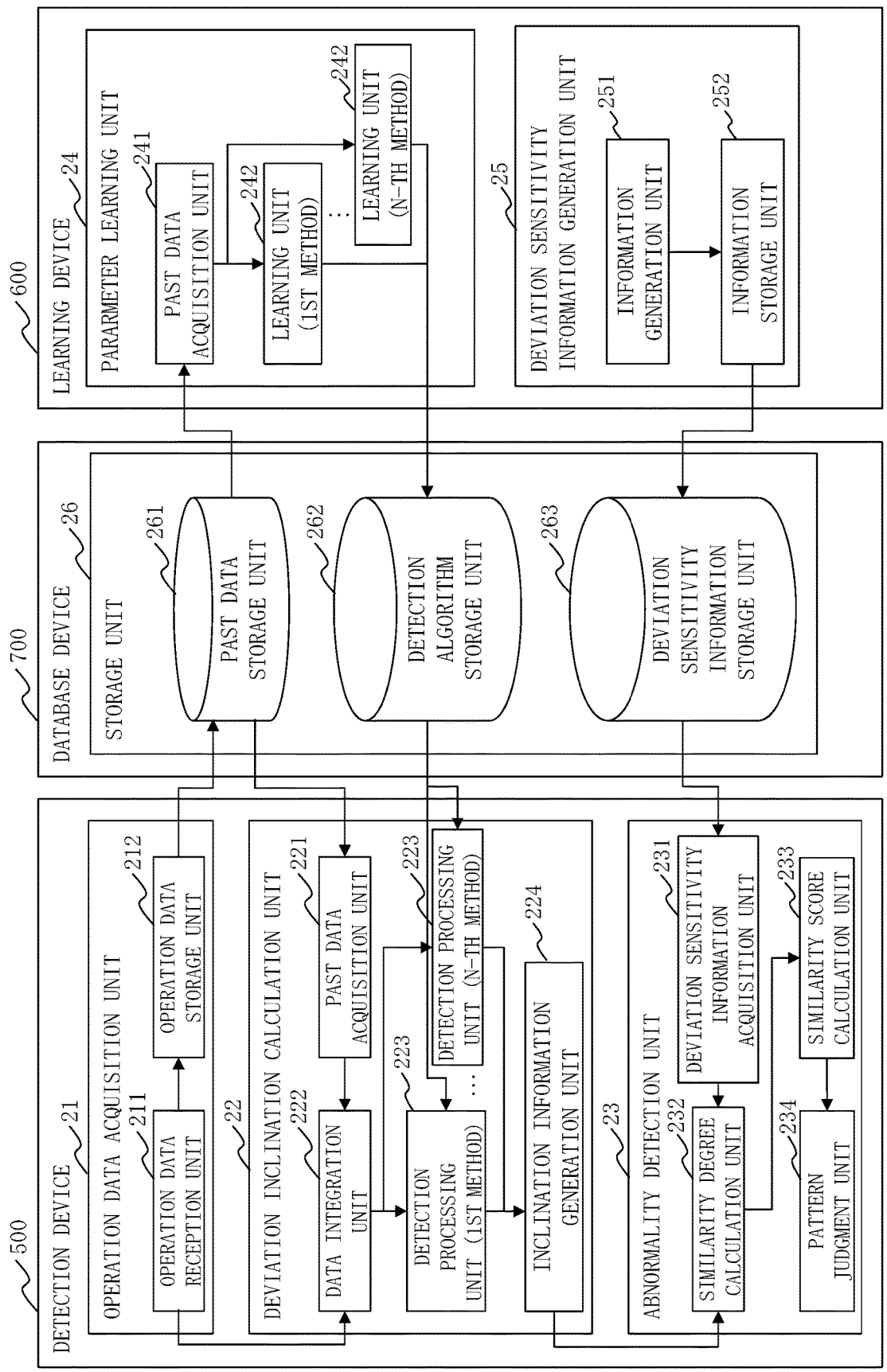
FIG. 17 is a diagram of a functional configuration of a detection device 500, a learning device 600 and a database device 700 according to the second embodiment.

With reference to FIG. 17, functional configurations of the detection device 500, the learning device 600, and the database device 700 according to the second embodiment will be described.

The detection device 500 is equipped with an operation data acquisition unit 21, a deviation inclination calculation unit 22 and an abnormality detection unit 23, as functional components. The learning device 600 is equipped with a parameter learning unit 24 and a deviation sensitivity information generation unit 25, as functional components. The database device 700 is equipped with a storage unit 26, as a functional component.

That is, in the second embodiment, the abnormality detection device 200 as illustrated in FIG. 3 is divided into the detection device 500 to perform an abnormality detection process, the learning device 600 to perform a learning process and a deviation sensitivity information generation process, and the database device 700 to store data.

By the configuration according to the second embodiment, it is possible to independently perform an abnormality detection process, and a learning process along with a deviation sensitivity information generation process. Therefore, it becomes easy to secure an execution speed of an abnormality detection process performed by online processing.

Third Embodiment

A third embodiment is different from the first and second embodiments in that the subject apparatus 100 is provided with a function to perform an abnormality detection process. In the third embodiment, this different point will be described, whereas explanation on the same points is omitted.

Figure 18:
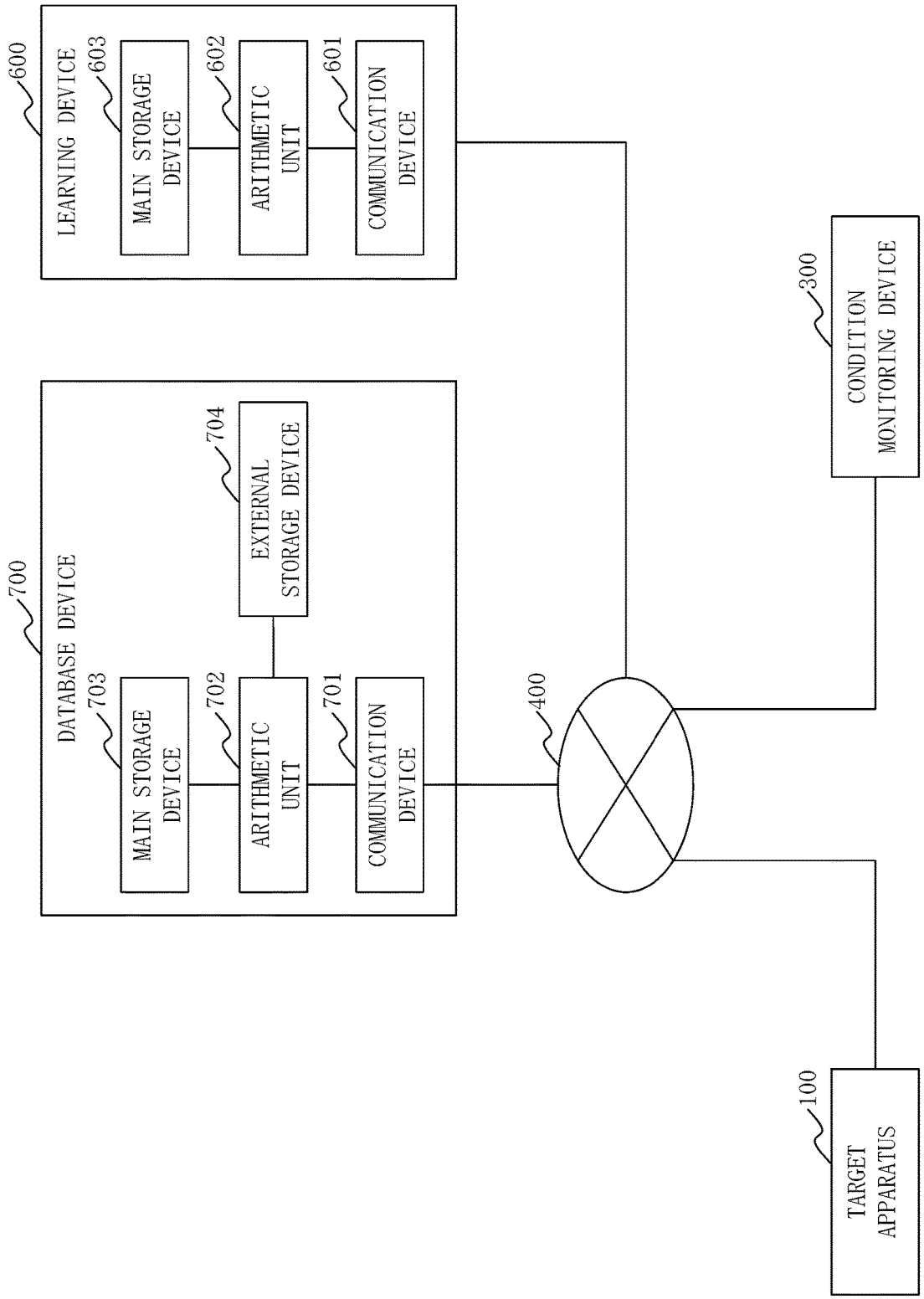
FIG. 18 is a diagram of a hardware configuration of an abnormality detection system 1 according to a third embodiment.

With reference to FIG. 18, a hardware configuration of an abnormality detection system 1 according to the third embodiment will be described.

The abnormality detection system 1 is different from the abnormality detection system 1 illustrated in FIG. 16, in that the abnormality detection system 1 is not equipped with a detection device 500.

Figure 19:
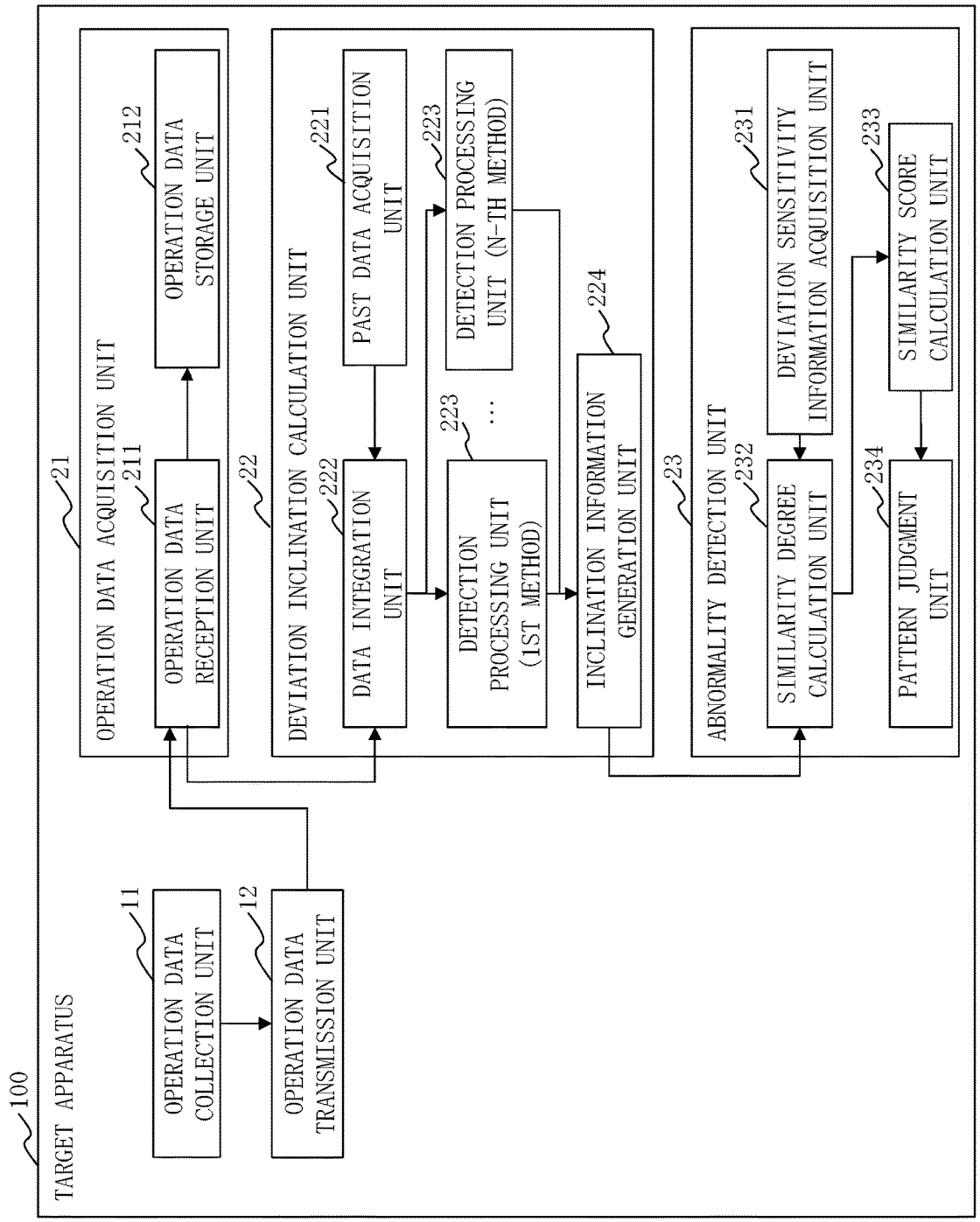
FIG. 19 is a diagram of a functional configuration of a target apparatus 100 according to the third embodiment.

With reference to FIG. 19, a functional configuration of the subject apparatus 100 according to the third embodiment will be described.

The subject apparatus 100 is different from the subject apparatus 100 illustrated in FIG. 2 in that the subject apparatus 100 is equipped with an operation data acquisition unit 21, a deviation inclination calculation unit 22 and an abnormality detection unit 23, which have been provided in the detection device 500, as functional components.

That is, in the third embodiment, the subject apparatus 100 is configured so as to perform an abnormality detection process.

By the configuration according to the third embodiment, it is possible to process an abnormality detection process by edge computing. This makes it possible to make continuous communication focus only on transmission of an abnormality judgment result and an abnormality pattern estimation result without the necessity of constantly performing transmission and reception of data such as operation data at all times for the purpose of continuous monitoring, etc. Therefore, it is possible to reduce the communication volume of a network 400.

In the third embodiment, it is described the configuration into which the configuration of the abnormality detection system 1 according to the second embodiment is transformed. However, it is also possible to transform the configuration of the abnormality detection system 1 according to the first embodiment.

REFERENCE SIGNS LIST

1: abnormality detection system; 100: subject apparatus; 101: operation apparatus; 102: control device; 103: sensor; 104: arithmetic unit; 105: main storage device; 106: communication device; 11: operation data collection unit; 12: operation data transmission unit; 200: abnormality detection device; 201: communication device; 202: arithmetic unit; 203: main storage device; 204: external storage device; 21: operation data acquisition unit; 211: operation data reception unit; 212: operation data storage unit; 22: deviation inclination calculation unit; 221: past data acquisition unit; 222: data integration unit; 223: detection processing unit; 224: inclination information generation unit; 23: abnormality detection unit; 231: deviation sensitivity information acquisition unit; 232: similarity degree calculation unit; 233: similarity score calculation unit; 234: pattern judgment unit; 24: parameter learning unit; 241: past data acquisition unit; 242: learning unit; 25: deviation sensitivity information generation unit; 251: information generation unit; 252: information storage unit; 26: storage unit; 261: past data storage unit; 262: detection algorithm storage unit; 263: deviation sensitivity information storage unit; 300: condition monitoring device; 301: communication device; 302: arithmetic unit; 303: main storage device; 304: display device; 31: result reception unit; 32: result output unit; 400: network; 500: detection device; 501: communication device; 502: arithmetic unit; 503: main storage device; 600: learning device; 601: communication device; 602: arithmetic unit; 603: main storage device; 700: database device; 701: communication device; 702: arithmetic unit; 703: main storage device; 704: external storage device

The invention claimed is:

1. An abnormality detection device comprising:
processing circuitry:
to calculate a deviation score by using evaluation data that is obtained from a subject apparatus as an input, in each of a plurality of outlier detection methods to specify data that is deviated from other data from among subject data, and to calculate a deviation score indicating an abnormality judgment rate being a degree to be judged abnormal from a deviation degree of the data specified, and to calculate deviation inclination information from the deviation score calculated, and to calculate, for each of a plurality of abnormality patterns, a similarity degree between deviation sensitivity information indicating a sensitivity being a level of an abnormality detection ability for each of the plurality of abnormality patterns with respect to each of the plurality of outlier detection methods, and the calculated deviation inclination information, and to detect an abnormality of the subject apparatus on a basis of the calculated similarity degrees associated with the plurality of abnormality patterns, wherein when the similarity degree calculated for at least one of the plurality of abnormality patterns is higher than a threshold value, the processing circuitry judges that an abnormality is detected.

2. The abnormality detection device as defined in claim 1, wherein the processing circuitry generates, as the deviation inclination information, vector information wherein the deviation score calculated in each of the plurality of outlier detection methods is arranged in a comparison order, and calculates, for each of the plurality of abnormality patterns, a similarity degree between the deviation sensitivity information wherein a sensitivity with respect to each of the plurality of outlier detection methods for each of the plurality of abnormality patterns is arranged in the comparison order, and the deviation inclination information.

3. The abnormality detection device as defined in claim 1, wherein the evaluation data is time-series data obtained from the subject apparatus, and the deviation score indicates a deviation degree of data obtained in an evaluation time period from among the time-series data.

4. The abnormality detection device as defined in claim 3, wherein the deviation score is a ratio of a number f of data that is judged to be deviated from other data, from among data obtained at a timing of L time in the evaluation time period.

5. The abnormality detection device as defined in claim 1, wherein the deviation sensitivity information indicates as the sensitivity a performance value in a case of detecting each of the plurality of abnormality patterns, by using past evaluation data as an input, in each of the plurality of outlier detection methods.

6. The abnormality detection device as defined in claim 5, wherein the deviation sensitivity information is expressed in any of a binary expression form wherein the sensitivity is represented by two values, and a level expression form wherein the sensitivity is represented by a real value in a reference range.

7. The abnormality detection device as defined in claim 6, wherein when the deviation sensitivity information is expressed in the level expression form, in the deviation sensitivity information, a sensitivity for each of the plurality of abnormality patterns with respect to each of the plurality of outlier detection methods is expressed in any form of a form wherein the sensitivity is represented by a real number in the reference range, a form wherein the sensitivity is represented by a real number so that a total value is standardized to be a reference value for each of the plurality of abnormality patterns, and a form wherein the sensitivity is represented by a real number so that a total value is standardized to be the reference value for each of the plurality of outlier detection methods.

8. The abnormality detection device as defined in claim 1, wherein each of the plurality of abnormality patterns is a pattern that may occur in the subject apparatus, and each of the plurality of outlier detection methods is a method that is capable of detecting at least one abnormality pattern from among the plurality of abnormality patterns.

9. The abnormality detection device as defined in claim 1, wherein the processing circuitry judges that an abnormality indicated by an abnormality pattern for which the similarity degree is highest occurs.

10. An abnormality detection method comprising:

calculating a deviation score by using evaluation data that is obtained from a subject apparatus as an input, in each of a plurality of outlier detection methods to specify data that is deviated from other data from among subject data, and to calculate a deviation score indicating an abnormality judgment rate being a degree to be judged abnormal from a deviation degree of the data specified, and calculating deviation inclination information from the deviation score calculated, and calculating, for each of a plurality of abnormality patterns, a similarity degree between deviation sensitivity information indicating a sensitivity being a level of an abnormality detection ability for each of the plurality of abnormality patterns with respect to each of the plurality of outlier detection methods, and the deviation inclination information calculated, and detecting an abnormality of the subject apparatus on a basis of the calculated similarity degrees associated with the plurality of abnormality patterns, wherein the abnormality of the subject apparatus is detected when the similarity degree calculated for at least one of the plurality of abnormality patterns is higher than a threshold value.

11. A non-transitory computer readable medium storing an abnormality detection program to make a computer perform:

a deviation inclination calculation process to calculate a deviation score by using evaluation data that is obtained from a subject apparatus as an input, in each of a plurality of outlier detection methods to specify data that is deviated from other data from among subject data, and to calculate a deviation score indicating an abnormality judgment rate being a degree to be judged abnormal from a deviation degree of the data specified, and to calculate deviation inclination information from the deviation score calculated, and an abnormality detection process to calculate, for each of a plurality of abnormality patterns, a similarity degree between deviation sensitivity information indicating a sensitivity being a level of an abnormality detection ability for each of the plurality of abnormality patterns with respect to each of the plurality of outlier detection methods, and the deviation inclination information calculated by the deviation inclination calculation process, and to detect an abnormality of the subject apparatus on a basis of the calculated similarity degrees associated with the plurality of abnormality patterns, wherein the abnormality of the subject apparatus is detected when the similarity degree calculated for at least one of the plurality of abnormality patterns is higher than a threshold value.

* * * * *